United States Patent
Terken et al.

(10) Patent No.: US 7,230,254 B2
(45) Date of Patent: Jun. 12, 2007

(54) MOVABLE CARRIAGE FOR A LITHOGRAPHIC APPARATUS AND DEVICE MANUFACTURING METHOD

(75) Inventors: Martinus Arnoldus Henricus Terken, Lierop (NL); Hernes Jacobs, Eindhoven (NL); Harmen Klaas Van Der Schoot, Vught (NL); Petrus Matthijs Henricus Vosters, Bladel (NL); Koen Jacobus Johannes Maria Zaal, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/231,791

(22) Filed: Sep. 22, 2005

(65) Prior Publication Data
US 2006/0011855 A1 Jan. 19, 2006

Related U.S. Application Data

(62) Division of application No. 10/860,654, filed on Jun. 4, 2004, now Pat. No. 7,012,264.

(51) Int. Cl.
*G21K 5/10* (2006.01)

(52) U.S. Cl. .............................. 250/442.11; 250/492.2

(58) Field of Classification Search ........... 250/442.11, 250/443.11, 492.2, 443.1
See application file for complete search history.

(56) References Cited

U.S. PATENT DOCUMENTS 7,012,264 B2 * 3/2006 Terken et al. .......... 250/442.11

* cited by examiner

*Primary Examiner*—Kiet T. Nguyen
(74) *Attorney, Agent, or Firm*—Pillsbury Winthrop Shaw Pittman LLP

(57) ABSTRACT

A movable carriage for moving an article support member in a lithographic apparatus is provided. The article support member is constructed and arranged to move and support an article to be placed in a beam path of the lithographic apparatus. The carriage includes a compartmented composite structure.

19 Claims, 7 Drawing Sheets

MOVABLE CARRIAGE FOR A LITHOGRAPHIC APPARATUS AND DEVICE MANUFACTURING METHOD

CROSS-REFERENCE TO RELATED APPLICATIONS

This application is a divisional of U.S. patent application Ser. No. 10/860,654, filed on Jun. 4, 2004, now U.S. Pat. No. 7,012,264, which issued on Mar. 14, 2006, the entire content of which is incorporated herein by reference.

BACKGROUND OF THE INVENTION

1. Field of the Invention

The present invention relates to a movable carriage for moving an article support member in a lithographic apparatus, a method of manufacturing a movable carriage, and a device manufacturing method.

2. Description of Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti parallel to this direction.

In conventional structures for moving and supporting the article support member, in particular, a wafer table for supporting a wafer to be irradiated by a radiation beam of the lithographic apparatus, or, a mask table for supporting a mask defining a circuit pattern, due to the extreme accurate positioning requirements, a carriage structure is used wherein the mechanical stiffness properties are optimal. Furthermore, due to the heat generated by the actuators for moving the carriage, and radiation received on the structure to be irradiated, a substantial need exists to provide cooling in the carriage structure. To this end, conventional materials like aluminum and titanium are used which are cooled by cooling circuits integrated in the structure. One problem related to the cooling and stiffness requirements of the carriage is that the options to provide further reduction of the weight thereof are rather limited, since there are minimum thicknesses to be observed for the carriage in order to maintain sufficient mechanical integrity. Such cooling is essential for these conventional materials, since slight temperature variations can result in unacceptable contracting or expanding of the material. Even a temperature fluctuation as little as 2° K. can cause sensors that are arranged for driving actuators for actuating the carriage to be displaced over a distance to be out of tolerance for placing the substrate on a predetermined position.

BRIEF SUMMARY OF THE INVENTION

It is an aspect of the present invention to overcome the above indicated problems and provide a lithographic that includes an illumination system for providing a projection beam of radiation; an article support member for supporting an article to be placed in a beam path of the projection beam of radiation on the article support; and a carriage for a lithographic apparatus that is light, stiff, and adequate in terms of cooling and mounting properties.

In another aspect of the invention, there is provided a movable carriage for use in a lithographic apparatus. The movable carriage is provided for moving an article support member in the lithographic apparatus. The article support member is constructed and arranged to move and support an article to be placed in a beam path of the lithographic apparatus. The carriage includes a compartmented composite structure.

In still another aspect of the invention, there is provided a method for manufacturing a movable carriage for moving an article support member in a lithographic apparatus. The article support member is constructed and arranged to move and support an article to be placed in a beam path of the lithographic apparatus. The method includes forming the carriage from a compartmented composite structure, and providing the compartmented composite structure with a non-composite mounting interface and/or cooling interface.

In a further aspect of the invention, a method for manufacturing a device with a lithographic apparatus is provided. The method includes projecting a beam of radiation, supporting an article with an article support member so that the article can be placed in a beam path of the beam of radiation, and moving the article support member with a carriage that includes a compartmented composite structure.

In particular, according to the invention, a carriage is provided. The carriage includes a compartmented composite structure. With such an arrangement, conventional interfacing, for example, using metal or ceramic materials, can be applied in combination with the advantages of composite structures, such as a low specific weight, a high Young's modulus at places and directions where required, high strength, high stability, high electrical resistivity, and a low coefficient thermal expansion (CTE). Due to the low CTE value, there is no need for applying a separate cooling arrangement for the carriage, which means that the carriage is made lighter and simpler in construction. Furthermore, unlike the conventional materials, like aluminum and titanium, no magnetic damping occurs, which, where a long stroke actuator in the form of a magnetic motor is used, is highly beneficial.

Furthermore, this particular arrangement offers a low cost product since it can be manufactured by gluing together very simple shaped structures. In addition, composite materials offer a range of complex shapes that are not possible to manufacture by conventional metals and ceramics.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 3 shows a perspective view of a plurality of molds for the boxed composite structure of FIG. 2a;

DETAILED DESCRIPTION OF THE INVENTION

Figure 1:
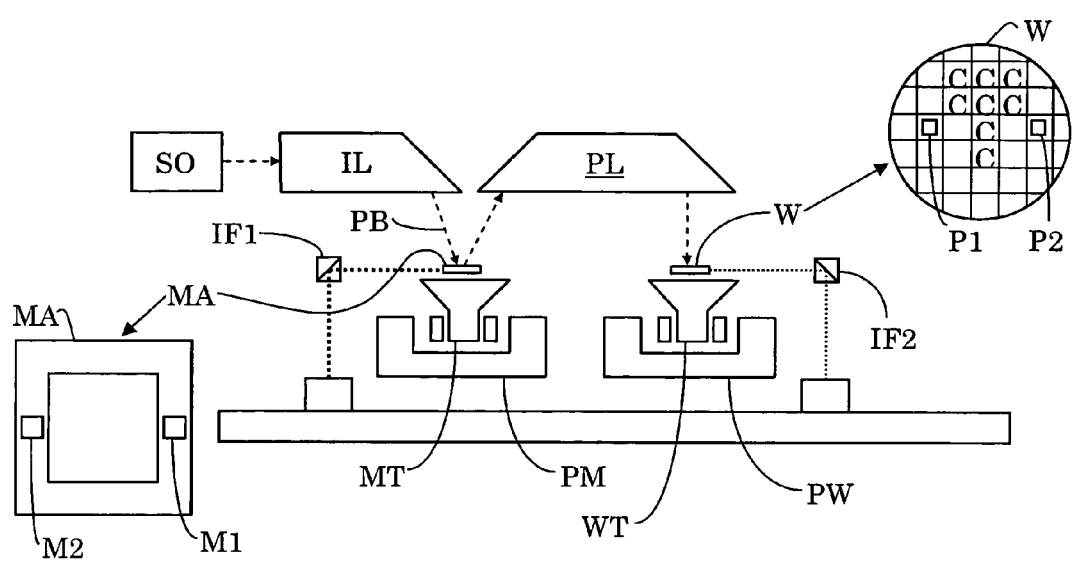
FIG. 1 depicts a lithographic apparatus according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed before or after exposure in, for example, a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example, with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

FIG. 1 schematically depicts a lithographic apparatus according to a particular embodiment of the invention. The apparatus includes: an illumination system (illuminator) IL for providing a projection beam PB of radiation (e.g. UV or EUV radiation); a first support structure (e.g. a mask table) MT for supporting a patterning device (e.g. a mask) MA and connected to a first positioning device PM for accurately positioning the patterning device with respect to item PL; a substrate table (e.g. a wafer table) WT for holding a substrate (e.g. a resist coated wafer) W and connected to a second positioning device PW for accurately positioning the substrate with respect to item PL; and a projection system (e.g. a reflective projection lens) PL for imaging a pattern imparted to the projection beam PB by the patterning device MA onto a target portion C (e.g. including one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example, when the source is a plasma discharge source. In such cases, the source is not considered to form part of the lithographic apparatus and the radiation beam is generally passed from the source SO to the illuminator IL with the aid of a radiation collector including for example suitable collecting mirrors and/or a spectral purity filter. In other cases, the source may be integral part of the apparatus, for example, when the source is a mercury lamp. The source SO and the illuminator IL, may be referred to as a radiation system.

The illuminator IL may include an adjusting device for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning device PW and position sensor IF2 (e.g. an interferometric device), the substrate table WT can be moved accurately, e.g. so as to position different target portions C in the path of the beam PB. Similarly, the first positioning device PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW.

Figure 2:
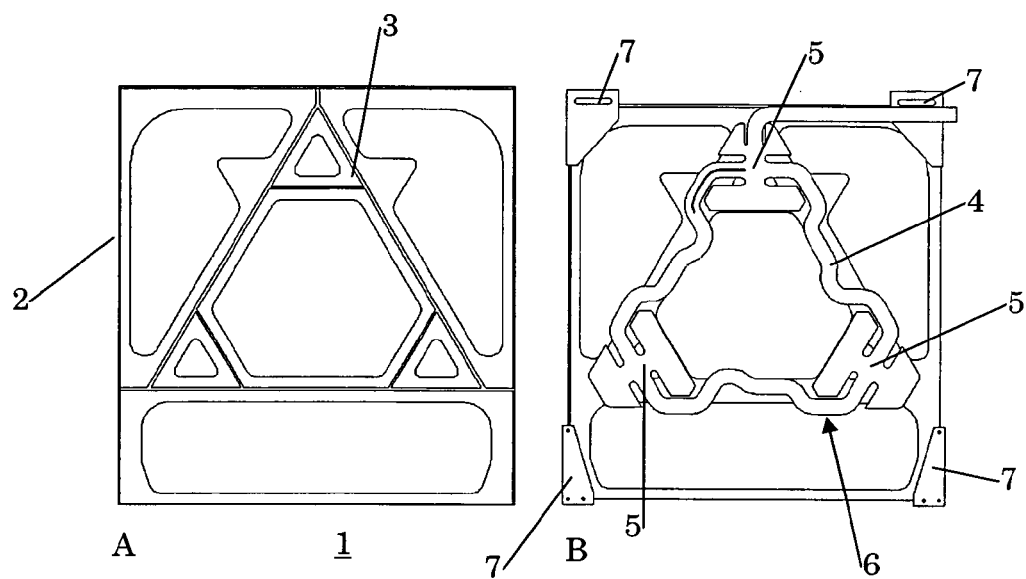
FIG. 2 depicts a schematic plan view of a boxed composite structure (a) provided with non-composite interfaces (b) according to the invention.

Another part of the positioning device PM and/or PW is a carriage which further embodies the invention and which will be further explained with reference to FIG. 2. Generally, this carriage may be seen as a stiff structure that moves over a perfectly flat surface, moved by the long stroke module. Generally, such a long stroke module may be provided by linear magnetic motors, which are mounted in transverse directions for covering a two-dimensional range of positions. However, preferably, the long stroke module includes a planar electro magnetic motor of the type that is for instance described in European patent EP-A-1243972, the contents of which are herein incorporated by reference. On top of the carriage, generally, the short stroke module is mounted for providing a fine positioning of the wafer table, which is mounted on top of the short stroke module. Thus, the carriage provides a frame between the long and short stroke modules and as such must be light weight and must provide high stiffness in combination with heavy loads.

However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Turning to FIGS. 2a and 2b, there is illustrated a top view of a compartmented composite structure 1. The composite structure 1 is manufactured of fiber enforced composite materials, such as carbon fibers, etc., and assembled as further indicated with reference to FIG. 4. A characteristic feature of the shown exemplary embodiment is a rectangular outer box 2 and a triangular inner box 3 provided in the outer box 2. Such an arrangement provides a very stiff structure, while still providing access to the interior of the compartmented structure which is used for housing wiring and electronics etc. (not shown). The triangular inner box 3 may be further divided by sub boxes and ribbing structures such as illustrated in FIG. 4 and FIGS. 9–11 in particular. A structure providing optimum access to the interior of the carriage is provided, while cooling ducts 4 are provided and arranged along the ribs of the structure, such as is illustrated in FIG. 2b. Here, the composite structure 1 of FIG. 2a is shown provided with a non-composite mounting interface 5 arranged near the corners of the triangle 3, for mounting a short stroke motor (not shown). Furthermore, the cooling duct 4, which is preferably constructed from aluminum, titanium, or stainless steel material or the like, provides cooling to the short stroke motor. The duct 4 may partly be formed by the composite box structure, for instance, by using an elongate compartment as a cooling duct. For such an embodiment, the metal surface may be only present at the cooling interface, which provides coolant to relevant electronic parts such as the short-stroke actuator (not shown), which may further minimize weight. The coolant ducts 4 are provided as a triangular metal plate 6 that covers the top face of the boxed structure 1, and corners of the plate are used for mounting the short-stroke module, thereby providing an optimum mounting arrangement for ultra stable positioning of the wafer table. Furthermore, robust corner elements 7 are added, generally of a metal material, for providing a high load interface providing improved stiffness and protection when the carriage structure 1 unexpectedly crashes against a side wall of the surface on top of which it is actuated.

Figure 3:
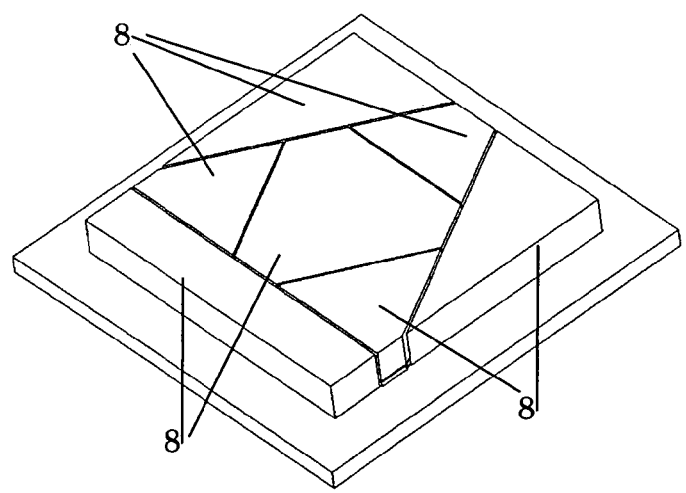
Figure 4:
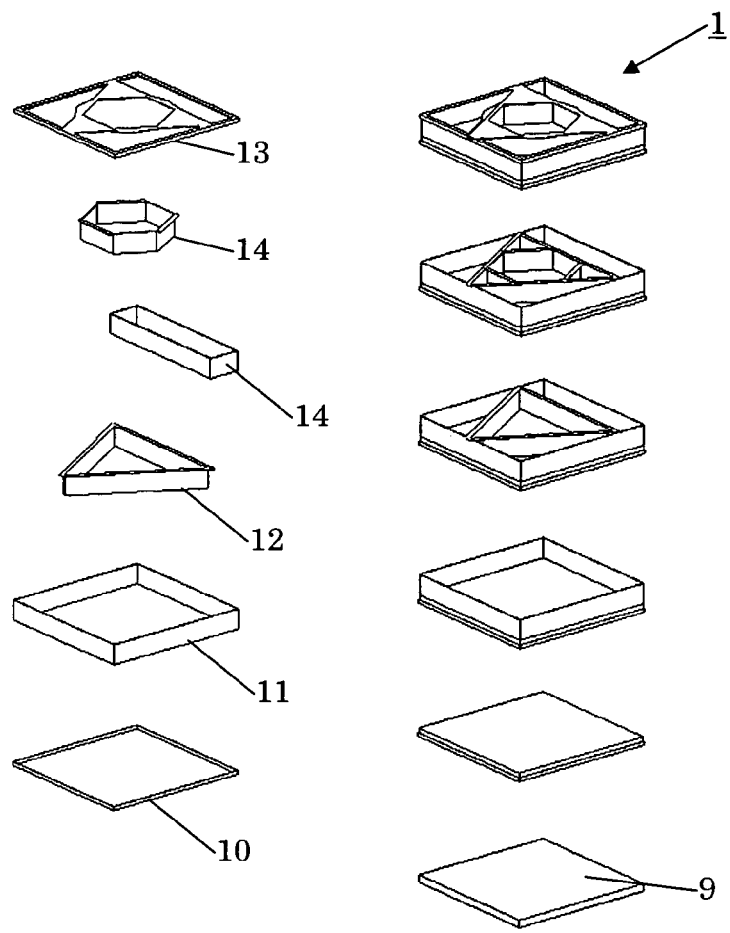
FIG. 4 schematically shows an assembly method for providing a carriage according to the invention.
Figure 12:
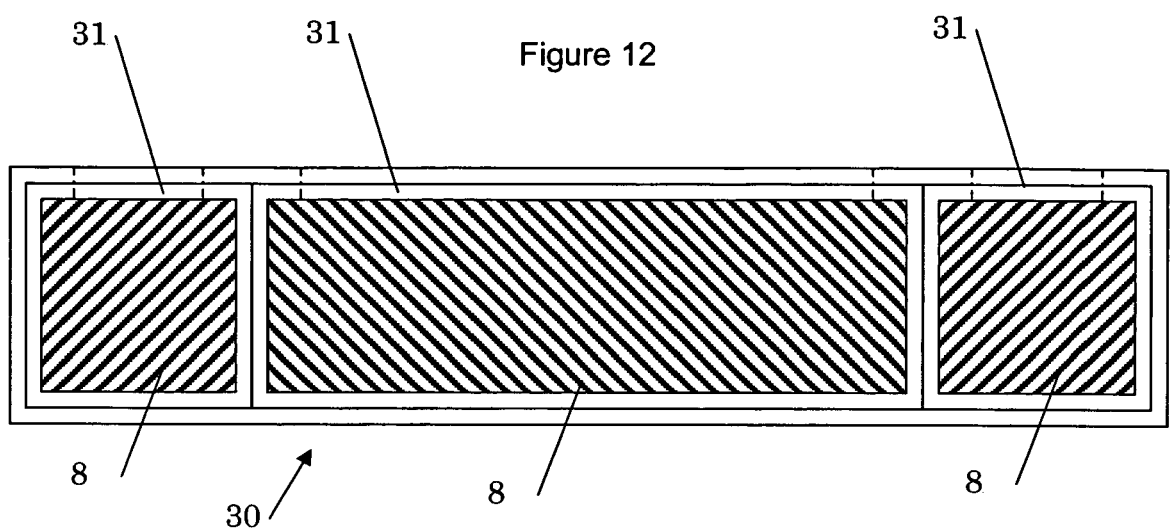
FIG. 12 is a schematic view of a mold for use in assembling the carriage according to the invention.
Figure 13:
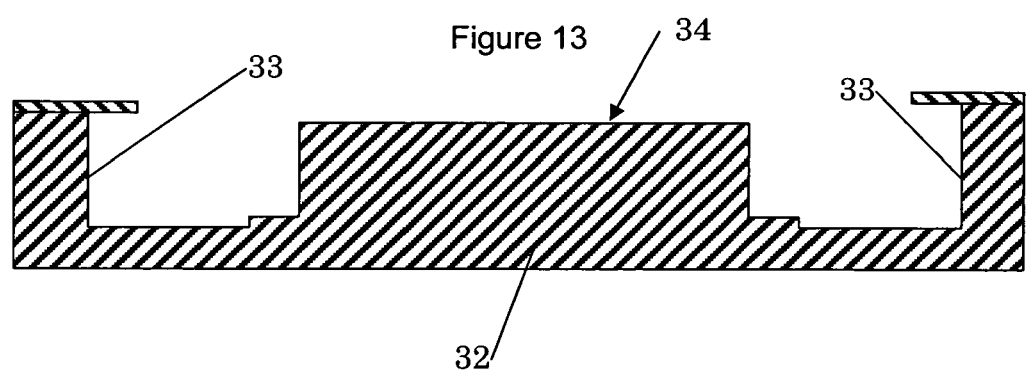
FIG. 13 is a schematic view of another mold for use in assembling the carriage according to the invention.

FIG. 3 clearly shows that the complex composite structure of the invention may be provided by assembly of substantially simple shaped structures such as square or triangular shapes that are easy to manufacture using molds 8, as also indicated with reference to the FIGS. 12 and 13. By using these molds 8, more complex shapes can be realized and integrated in order to reduce the amount of parts (production steps) that have to be glued together afterwards. As shown in FIG. 4, a series of assembly steps using these molds 8 is depicted, starting from the right bottom picture and adding subsequently a first upstanding rim contour 10 on a bottom plate 9. Next, a square upstanding rectangular contour 11 is provided, which is mounted on the bottom plate 9. A triangular shaped box 12 is inserted in the rectangular contour 11, the triangular box provided with an L-form extremal mounting profile for gluing to a top plate 13. Next, further box elements 14 for providing greater stiffness to the carriage may be added. Finally top plate 13 is mounted and glued on top of the upstanding contours 11, 12 and 14.

Figure 5:
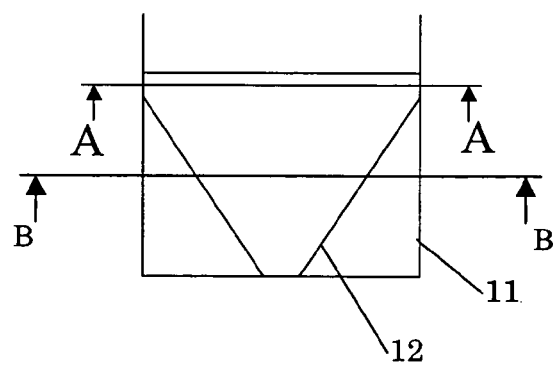
FIG. 5 is a top view of an embodiment of a carriage according to the invention.
Figure 6:
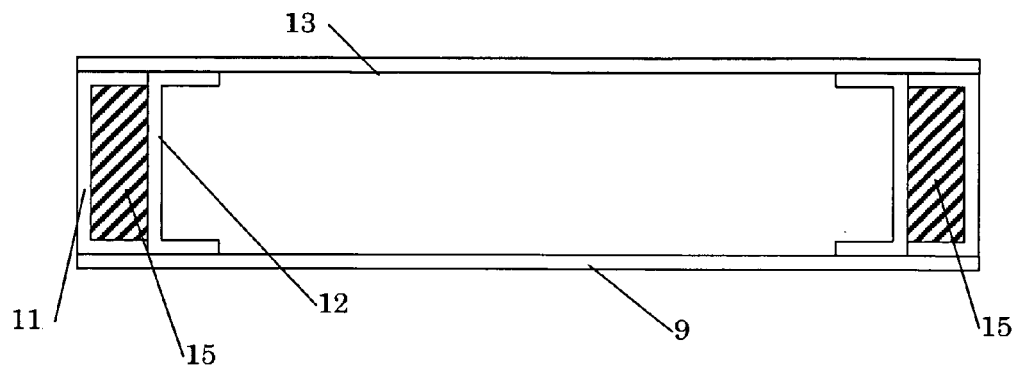
FIG. 6 is a cross-sectional view taken along line A—A of FIG. 5.
Figure 7:
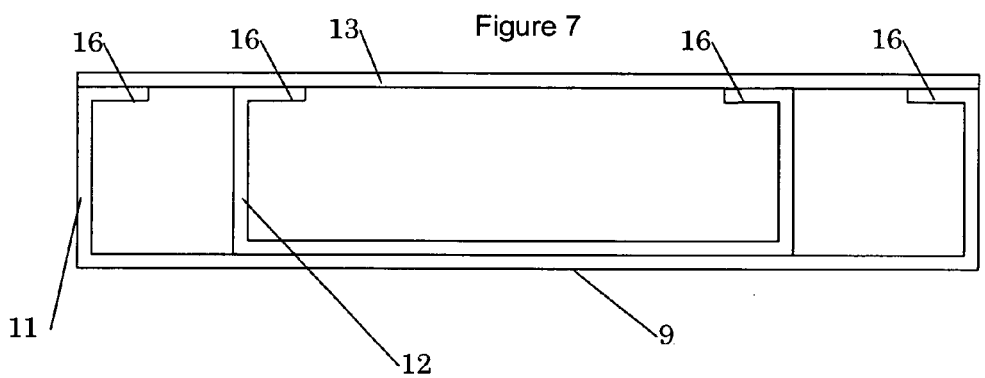
FIG. 7 is a cross-sectional view taken along line B—B of FIG. 5.
Figure 8:
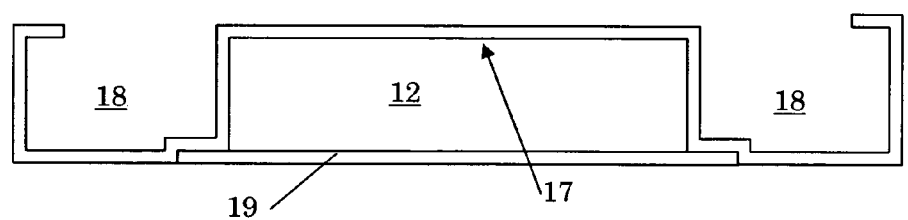
FIG. 8 an alternative cross-sectional view taken along line B—B of FIG. 5.

FIG. 5 shows a top view of the triangular structure 11, further elucidated with reference to FIG. 6-8 showing a plurality of cross-sectional views for the composite structure. FIG. 6 shows a cross-sectional view of the triangular structure 12, at position A—A (FIG. 5). Here, upstanding profile may be a U-formed profile, having L-form extremal mounting profiles for gluing the structure 12 to a bottom plate 9 and/or top plate 13. Between the rectangular outer contour 11 and the triangular inner structure 12, a mounting interface of, for example, an aluminum plate 15 may be provided.

FIG. 7 and FIG. 8 show alternatives for the cross sectional area depicted as B—B in FIG. 5. According to FIG. 7, the outer contours 11 and inner contour 12 are provided as boxes, which is also depicted in FIG. 4. Thus, the inner triangular box 12 is glued on base plate 9, having upstanding contours 11 integral with the base plate 9. Top plate 13 is mounted on the upstanding contours 11, 12 using L-form extremal mounting profiles 16. FIG. 8 shows an alternative configuration, where a complex upper member 17 partly forms the rectangular structure 11 (side chambers 18) and triangular structure 12 (inner chamber). A lower bottom plate 19 forming a bottom plate for the triangular structure 12 may be glued to the complex member 17.

Figure 9:
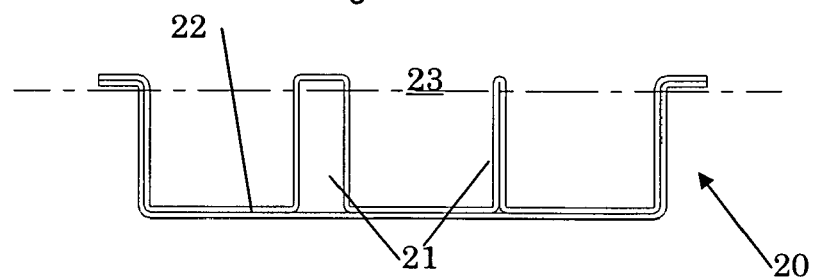
FIG. 9 is a schematic view of a boxing and ribbing structure for providing the carriage according to an embodiment of the invention.
Figure 10:
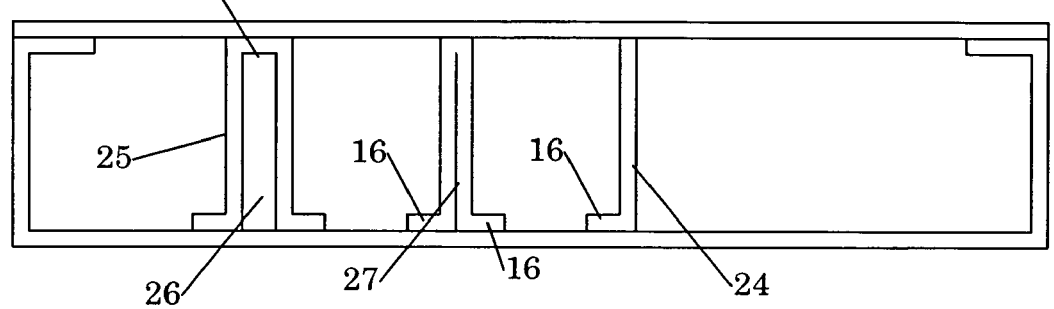
FIG. 10 is a schematic view of the boxing and ribbing structure for providing the carriage according to another embodiment of the invention.
Figure 11:
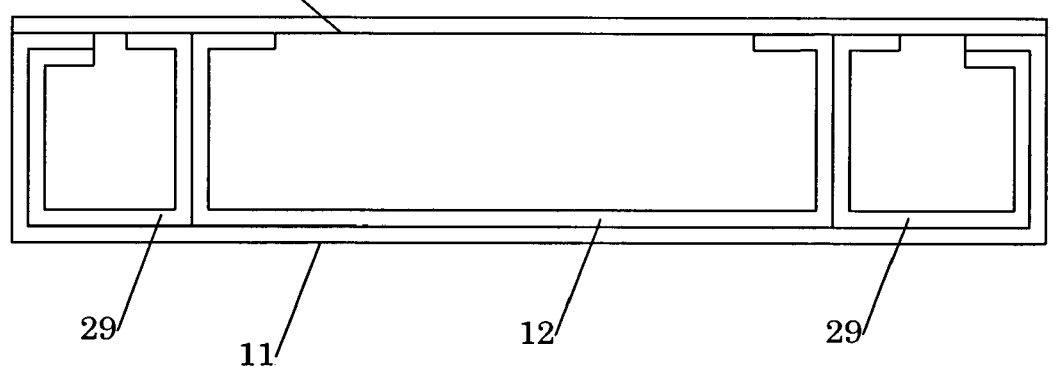
FIG. 11 is a schematic view of the boxing and ribbing structure for providing the carriage according to another the invention.

FIGS. 9–11 show a plurality of alternative boxing and ribbing structures for providing the carriage according to the invention. FIG. 9 shows that a complex structure 20 as shown, for example, in FIG. 8 may be further provided with ribbing structures 21 by using a single sheet 22 of composite material. After removing a top section 23 of the complex structure 20, the ribs 21 stand upright and may be glued to a top sheet afterwards. FIG. 10 shows a variety of ribbing elements 21, in particular, a narrow asymmetrical rib 24, which only has one side L-form extremal mounting profile 16, a wide rib 25 which forms an interior chamber 26 and a symmetrical rib 27, which only has both sides L-form extremal mounting profiles 16. These interior chambers 26 could, for example, be used as cooling ducts, or, such as indicated by FIG. 9, have the top side 28 milled to provide two asymmetrical ribs. Also, as indicated by FIG. 11, extra boxes 29 may be added to create symmetrical ribs.

FIGS. 12–13 provide exemplary embodiments for molds 8 for use in assembling the carriage according to the invention. The molds 8 are wrapped up to provide a single piece 30. By using a single sheet and several molds, multiple compartments 31 may be provided. The molds 8 are removed by milling the top surface of the pieces 30. FIG. 13 may be used in combination with the interior molds 8, such as depicted in FIG. 12. Depicted is an exterior mold 32 which, by side walls 33 defines the contour of rectangular box 11, and by interior bulk part 34 defines the triangular shape of triangular structure 12.

Figure 14:
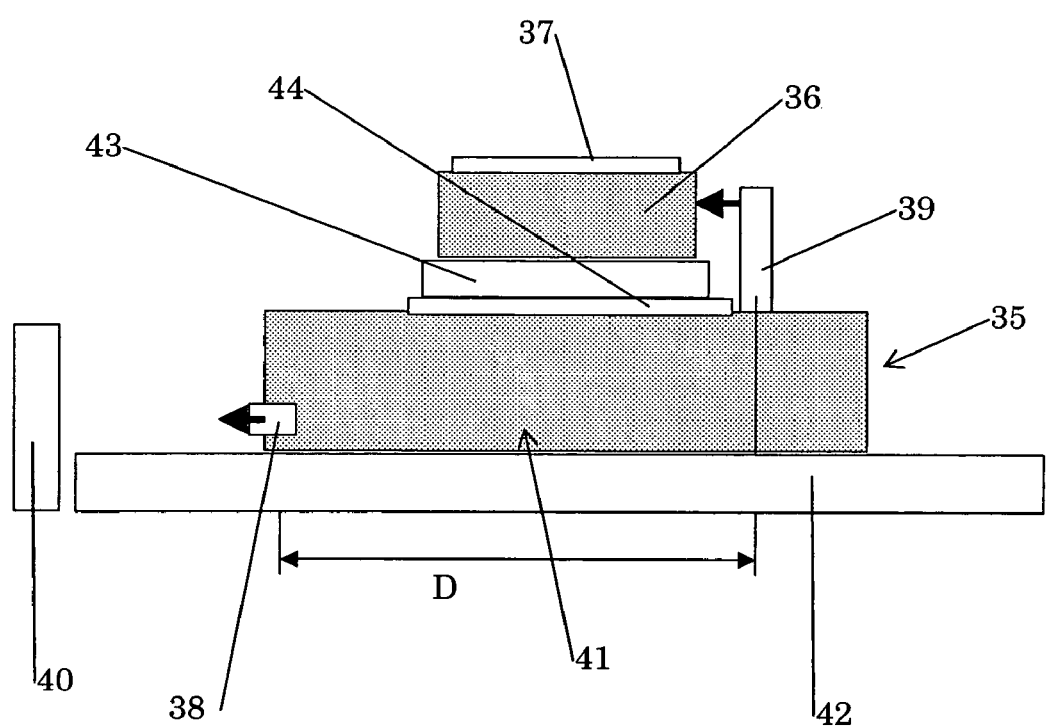
FIG. 14 shows a movable carriage for moving an article support member according to the invention.

FIG. 14 shows a movable carriage 35 for moving a wafer table 36 in a lithographic apparatus for moving and supporting an article 37 to be placed in a beam path of the lithographic apparatus. The carriage 35 includes a compartmented composite structure as indicated with reference to the FIGS. 2a and 2b. As can be seen in the figures, a plurality of sensors 38, 39 are mounted on the carriage 35, which are used for positioning the article 37 with respect to a positional reference 40. These sensors are located at a distance D, which, in principle, can be responsible for position measurement problems due to temperature effects. However, due to the very low coefficient of thermal expansion, especially where the used composite materials 41 include carbon fibers, these variations can be kept within a controllable range. Additional cooling of the carriage frame 35 may thereby be circumvented. This results in a lighter and simpler construction.

A first sensor 38 is for positioning the carriage with respect to the long stroke actuator, which, for example may be a planar motor 42. A second sensor 39, located at a position different from the first sensor 38, is for positioning the wafer table 36 with respect to the carriage 35, in order to position the article 37. The second sensor 39 communicates with the short stroke actuator 43 that is mounted on top of the carriage 35. This may be performed by conventional mounting interfaces 44, optionally included with cooling interfaces, that are glued on the composite material of the carriage 35.

Although the invention has been described with reference to a carriage structure specifically designed for carrying the short stroke module of a wafer table, it is not limited thereto, but, in practice, could also be used for other interfaces between long- and short stroke actuators. These actuators, for example, could be present in a mask table of a photolithographic apparatus using reflective mask technology or arrangements for actuating other elements into the light beam such as a obscuring blades or the like.

While specific embodiments of the invention have been described above, it will be appreciated that the invention may be practiced otherwise than as described. The description is not intended to limit the invention.

What is claimed is:

1. A movable carriage for moving an article support member in a lithographic apparatus, said article support member constructed and arranged to move and support an article to be placed in a beam path of said lithographic apparatus, said carriage comprising a compartmented composite structure.

2. A movable carriage according to claim 1, wherein said carriage is constructed and arranged to provide an interface between a long stroke and a short stroke actuator in the lithographic apparatus, and wherein said carriage further comprises a first sensor for driving said long stroke actuator and a second sensor, positioned at a distance from said first sensor, for driving said short stroke actuator so as to arrange said article to be placed on a predetermined location.

3. A movable carriage according to claim 1, further comprising a non-composite mounting interface and/or cooling interface for mounting and/or cooling a short stroke actuator.

4. A movable carriage according to claim 3, wherein said carriage is uncooled.

5. A movable carriage according to claim 3, wherein said non-composite mounting interface comprises a metal and/or ceramic material glued to said composite material.

6. A movable carriage according to claim 3, wherein said cooling interface comprises a metal cooling surface.

7. A movable carriage according to claim 6, wherein said metal cooling surface is coupled to a duct for ducting coolant.

8. A movable carriage according to claim 7, wherein said duct comprises a composite material.

9. A movable carriage according to claim 1, wherein said composite is chosen from a group of low coefficient of thermal expansion (CTE) materials.

10. A movable carriage according to claim 9, wherein said composite comprises carbon fiber.

11. A movable carriage according to claim 1, wherein said composite structure comprises at least one composite box structure.

12. A movable carriage according to claim 11, wherein said box structure comprises a base plate and upstanding contours.

13. A movable carriage according to claim 12, wherein the upstanding contours are integral with the base plate.

14. A movable carriage according to claim 12, wherein the upstanding contours comprise an L-form extremal mounting profile for gluing to a cover plate.

15. A movable carriage according to claim 11, wherein said composite box structure comprises a rectangular outer box and a triangular inner box provided in said outer box.

16. A movable carriage according to claim 11, wherein said composite box structure comprises a composite rib structure.

17. A movable carriage according to claim 16, wherein said rib structure is glued to the box structure.

18. A movable carriage according to claim 17, wherein said rib structure comprises an L-form extremal mounting profile for gluing to a cover plate.

19. A movable carriage according to claim 1, wherein said composite structure comprises a plurality of boxed compartments glued together.

* * * * *